United States Patent
Corisis

(10) Patent No.: US 7,056,771 B2
(45) Date of Patent: *Jun. 6, 2006

(54) METHOD OF FORMING AN ARRAY OF SEMICONDUCTOR PACKAGES

(75) Inventor: David J. Corisis, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/174,608

(22) Filed: Jul. 6, 2005

(65) Prior Publication Data

US 2005/0253237 A1    Nov. 17, 2005

Related U.S. Application Data

(60) Division of application No. 10/043,104, filed on Jan. 14, 2002, which is a continuation of application No. 09/731,803, filed on Dec. 8, 2000, now Pat. No. 6,376,277, which is a division of application No. 09/191,037, filed on Nov. 12, 1998, now Pat. No. 6,184,465.

(51) Int. Cl.
*H01L 21/44* (2006.01)

(52) U.S. Cl. .................................. 438/126
(58) Field of Classification Search ........ 438/106–127, 438/612–617; 174/52.4
See application file for complete search history.

(56) References Cited

U.S. PATENT DOCUMENTS

| | | |
|---|---|---|
| 5,420,460 A | 5/1995 | Massingill |
| 5,598,096 A | 1/1997 | Pham et al. |
| 5,608,262 A | 3/1997 | Degani et al. |
| 5,719,440 A | 2/1998 | Moden |
| 5,874,784 A | 2/1999 | Aoki et al. |
| 5,886,398 A | 3/1999 | Low et al. |
| 5,895,967 A | 4/1999 | Stearns et al. |
| 5,900,676 A | 5/1999 | Kweon et al. |
| 5,910,687 A | 6/1999 | Chen et al. |
| 6,376,277 B1 * | 4/2002 | Corisis ................. 438/106 |

FOREIGN PATENT DOCUMENTS

JP            10064854 A  *  3/1998

* cited by examiner

*Primary Examiner*—Brook Kebede
(74) *Attorney, Agent, or Firm*—Dickstein Shapiro Morin & Oshinsky LLP

(57) ABSTRACT

A semiconductor package is provided which includes a substrate having a plurality of semiconductor dice mounted thereon. The substrate is divided into segments by grooves formed in the bottom surface of the substrate. Each semiconductor die is electrically connected to the substrate by electrical connections which extend from bond pads on the semiconductor die to corresponding bond pads on the substrate. An encapsulant is formed over each segment and contains grooves which correspond to the grooves of the substrate. Break points are thus formed at the grooves to permit the segments to be easily detached from the substrate to form individual integrated circuits.

4 Claims, 6 Drawing Sheets

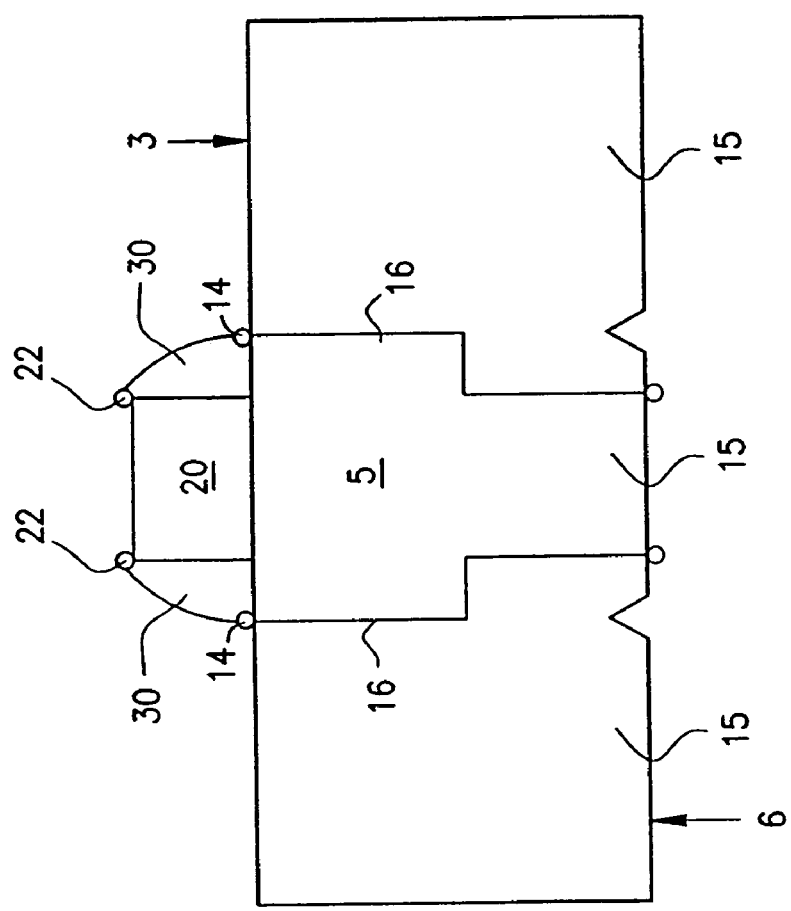

METHOD OF FORMING AN ARRAY OF SEMICONDUCTOR PACKAGES

CROSS REFERENCE TO RELATED APPLICATIONS

This application is a Divisonal Application of application Ser. No. 10/043,104, filed Jan. 14, 2002, which is a Continuation Application of application Ser. No. 09/731,803 filed on Dec. 8, 2000, now U.S. Pat. No. 6,376,277, which is a Divisional Application of application Ser. No. 09/191, 037, filed on Nov. 12, 1998, now U.S. Pat. No. 6,184,465, which is hereby incorporated by reference.

BACKGROUND OF THE INVENTION

The present invention relates generally to semiconductor packaging, and more particularly to a package for a plurality of semiconductor dice, which are singulated into individual integrated circuits.

Generally, in semiconductor manufacturing, an individual semiconductor die is mounted to a substrate and then sealed by an encapsulant or by a molding operation. The sealed package protects the die from breakage, and hazardous environmental contaminants. In addition, the package provides a lead system for connecting the resulting integrated circuit to a plurality of other similar circuits on a printed circuit board in an electronic system.

The semiconductor die includes a non-active surface which is typically mounted to a die receiving area on the substrate, and an active surface which has circuitry formed thereon. The circuitry is electrically connected to the substrate by bond pads formed on the active surface to corresponding bond pads on the substrate.

The initial component of the package is the substrate, for example, a lead frame. Typically, a lead frame supports a plurality of dice for packaging, and provides the leads for the final semiconductor package. The lead frame may be formed from a metal sheet of material. During the packaging process, each semiconductor die is mounted to a die paddle of a die receiving area by an adhesive. The adhesive is typically formed between the non-active face of the semiconductor die and the top surface of the die paddle.

During the packaging process, the bond pads formed on the semiconductor die are electrically connected to the leads of the lead frame using bond wires. An encapsulating layer is then formed over a portion of or across the entire active surface of the semiconductor die to seal the die and lead frame in a final package. After the package is sealed, the semiconductor packages are singulated by, for example, a trim and form operation, and the leads are bent to a desired configuration.

Recent advances in semiconductor manufacturing have led to a demand for smaller devices which may perform more functions. Thus, more input/output connection have been formed onto the semiconductor die, thereby increasing circuit densities. Common methods for securing these circuits to the substrate are wirebonding and tape-automated bonding (TAB). In TAB, the metal tape leads are attached between the bond pads on the semiconductor die and the bond pads on the substrate. In wirebonding, a plurality of electrical connections are formed one at a time between a bond pad on the semiconductor die and a corresponding pad on the substrate.

Due to the increased demand for high input/output chips, the semiconductor dies are typically formed in an array. Known packaging techniques includes ball grid array, dual-in line, flat pack, and hermetic and plastic chip carrier.

As mentioned above, the semiconductor die are formed on a substrate. In ball grid array (BGA) and fine-pitched ball grid array (FBGA) packaging, the substrate is typically formed from an organic material such as bismaleimide triazine (BT) resin. The BT resin is usually supplied as a sheet of material, and a plurality of semiconductor dice are formed in an array on the sheet of material. Once the electrical connections are formed, the semiconductor is sealed by molding or encapsulation by, for example, a glob top.

When a molding operation is used, the entire top surface of the substrate, with the semiconductor dice mounted thereon, is covered with a mold compound. The dice are then singulated by a trim and form operation.

One drawback to this method is that the resulting package is complex to manufacture because the resulting packages must be singulated by a precision sawing operation to avoid damage to the semiconductor dice. Typically, a saw or jig is used. The pressure which results from the saw blade cutting the mold may, for example, damage the electrical connections formed on the semiconductor die.

SUMMARY OF THE INVENTION

In general, the invention is directed to a semiconductor package which includes a substrate having a plurality of dice mounted thereon. The substrate includes a plurality of grooves to allow the semiconductor dice to be easily detached from the substrate to form individual integrated circuits.

Accordingly, in one aspect, the package includes a substrate having a first surface and a second surface. A plurality of first grooves are formed on the first surface to form a plurality of segments in the substrate. A semiconductor die is mounted to a corresponding segment on the second surface. An encapsulant is formed over the semiconductor die, and forms a plurality of second grooves formed in the encapsulant to correspond to the plurality of first grooves. A plurality of break points are formed from the first and second grooves to separate the individual segments from the substrate.

Implementations of the invention include one or more of the following. The substrate is formed from ceramic. The encapsulant is formed from a bismaleimide triazine resin. The plurality of first and second grooves are formed at an angle. The package is one of a ball grid array and a fine-pitched ball grid array package. The plurality of semiconductor dice are electrically connected to the substrate.

In another aspect, the invention is directed to a method for singulating a semiconductor package which includes a substrate having a first surface and a second surface. A plurality of grooves are formed in the first surface of the substrate to separate the substrate into a plurality of segments. A semiconductor die is mounted to each of the plurality of segments. The method further includes forming an encapsulant on each of the segments, wherein the encapsulant has a plurality of second grooves corresponding to the plurality of first grooves. A plurality of break points are formed form the first and second grooves such that each of the plurality of segments of the substrate is separated at a corresponding break point.

Implementation of the method include the following. The segments may be separated from the substrate by a shearing or punching operation.

Other advantages and features of the present invention will become apparent from the following description, including the drawings and claims.

BRIEF DESCRIPTION OF THE DRAWINGS

FIG. 5 illustrates the electrical connections between the semiconductor die and the substrate.

DESCRIPTION OF THE PREFERRED EMBODIMENTS

Figure 1:
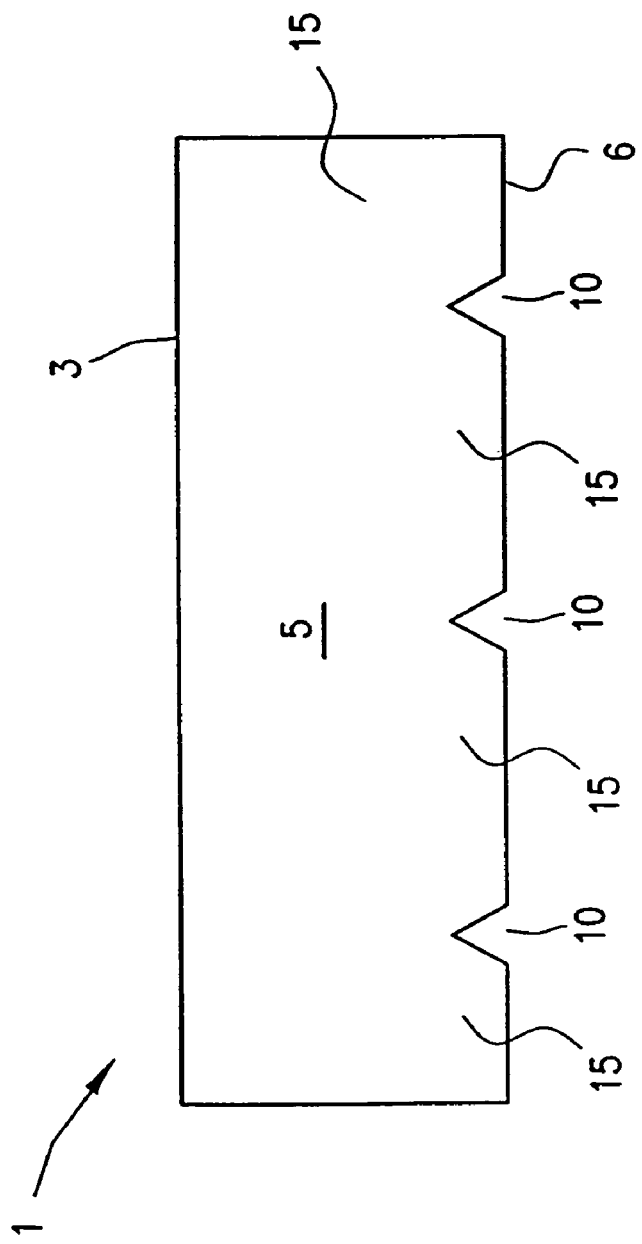
FIG. 1 illustrates a substrate for a semiconductor package in accordance with the present invention.

FIG. 1 illustrates a semiconductor package 1 in accordance with the present invention. Semiconductor package 1 may be a ball grid array (BGA) or fine-pitched ball grid array package FBGA. Semiconductor package 1 includes a substrate 5. Substrate 5 includes a top surface 3 and a bottom surface 6. Substrate 5 may be formed from any ceramic or other suitable material.

Substrate 5 also includes a plurality of grooves 10 which are formed in bottom surface 6. Grooves 10 may be formed by milling, etching, or scribing. The grooves 10 separate substrate 10 into a plurality of segments 15. Each of the segments 15 may be approximately the same length or different lengths depending on the application. Segments 15 generally define the length of an individual semiconductor die package formed from substrate 5. Grooves 10 are formed at an angle relative the to the bottom surface 6 of substrate 5. For example, grooves 10 may be formed in the shape of an inverted "V". Grooves 10 may have a depth of about 1–3 millimeters. Grooves 10 also permit the individual packages to be easily separated from substrate 5 as discussed below.

Figure 2:
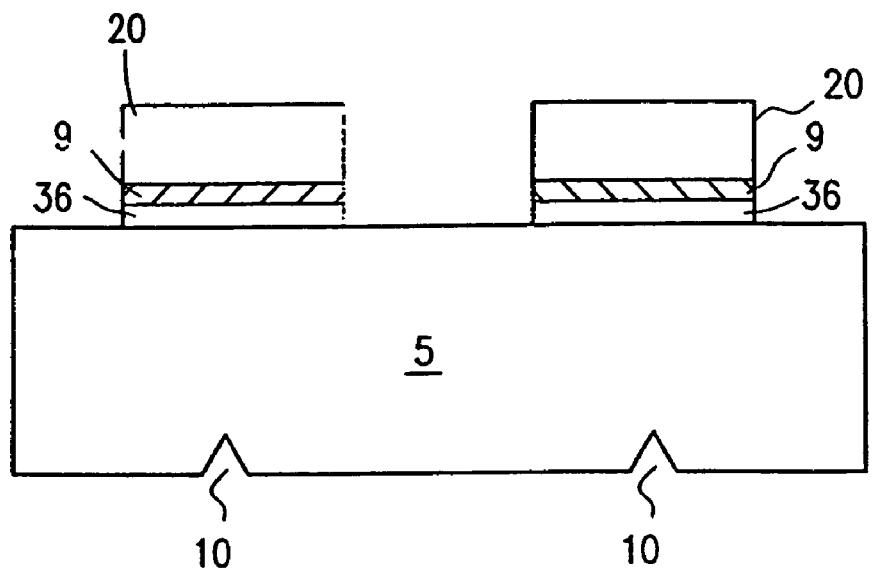
FIG. 2 illustrates a semiconductor die mounted to the substrate of FIG. 1.

Referring now to FIG. 2, substrate 5 includes a die mounting area 36. A semiconductor die 20 is mounted to the die mounting area 36 such that its non-active surface contacts the die mounting area 36. To secure the semiconductor die to the die mounting area 36, an adhesive layer 9 is formed onto the mounting area. Adhesive layer 9 may be formed from epoxy, acrylic, silicon, or other suitable dielectric material.

Figure 3:
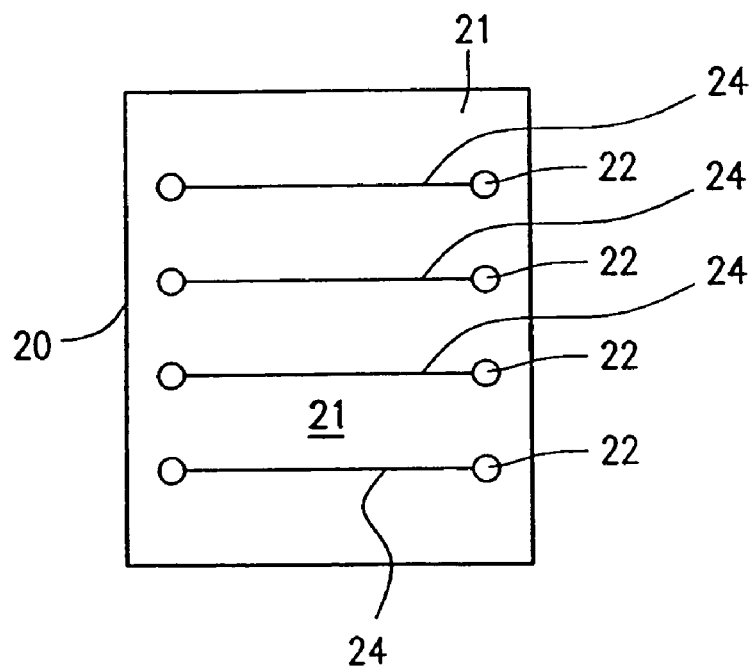
FIG. 3 illustrates a top view of the semiconductor die of FIG. 2.

FIG. 3 illustrates the semiconductor die 20 with a row of bond pads 22 formed on an active surface 21 of the die 20 along its peripheral edges. The active surface 21 also includes a plurality of circuit traces 24 formed between the bond pads 22. Bond pads 22 may be formed onto active surface 21 of semiconductor die 20 by laminating, etching, or other suitable techniques.

Figure 4:
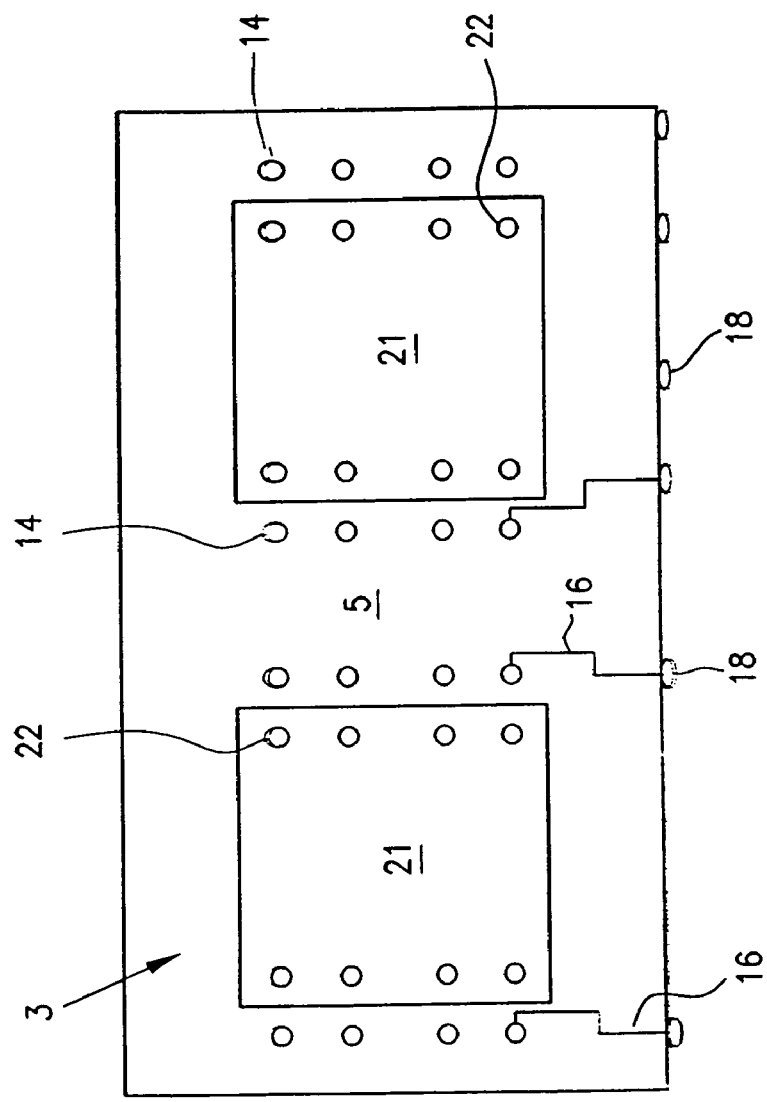
FIG. 4 illustrates the circuitry formed on the substrate of FIG. 1.

Referring now to FIG. 4, substrate 5 may include a plurality of bond pads 14 and a plurality of electrical conductive terminals 18. A plurality of circuit traces 14 may also formed between top surface 3 and bottom surface 6 of substrate 10 to provide an electrical path between bond pads 14 and terminals 18. Bond pads 14 and circuit traces 16 may be formed onto surface 3 by etching, milling, or other suitable techniques. Bond pads 14 may be formed from gold or copper. Circuit traces 16 may be formed from gold, aluminum, copper, or other suitable material.

Referring again to FIG. 4, conductive terminals 18 are formed onto bottom surface 6. It should be noted however that the conductive terminals 18 may also be formed onto the top surface 3 depending on the application. Conductive terminals 18 provide the electrical contact between the substrate 5 and a printed circuit board (PCB) (not shown). In particular, each conductive terminal 18 electrically connects a specific terminal or bond pad of semiconductor die 2 to a corresponding terminal on the PCB.

FIG. 5 illustrates the semiconductor die 20 electrically connected to substrate 5 by electrical connections 30. Electrical connections 30 extend from one of the bond pads 22 of semiconductor die 20 to a corresponding bond pad 14 on substrate 5. Electrical connections may be formed, for example, by wirebonding or conventional direct flip-chip attach processes. Suitable wirebonding techniques include thermosonic wirebonding, ultrasonic wirebonding, and thermo-compression wirebonding.

During the packaging process, after the semiconductor die is electrically connected to the substrate, an encapsulant is formed over the die-substrate assembly to protect the die from damage. Typically, the encapsulant is formed over an array of semiconductor dice 20 or segments 15. A sawing or shearing operation is then performed to separate the segments 15 into individual packages.

Figure 6A:
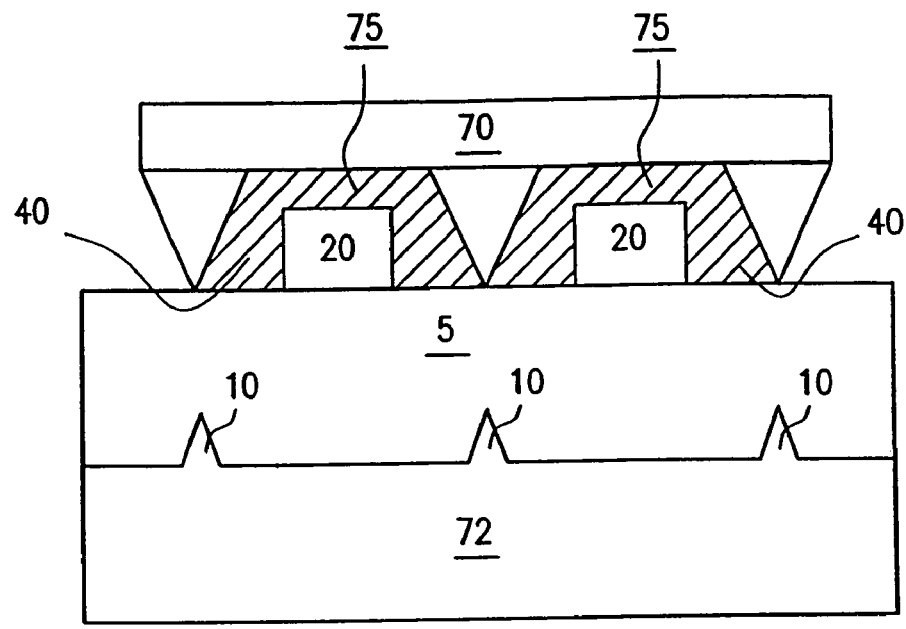
FIG. 6A illustrates a molding apparatus in accordance with the present invention.
Figure 6B:
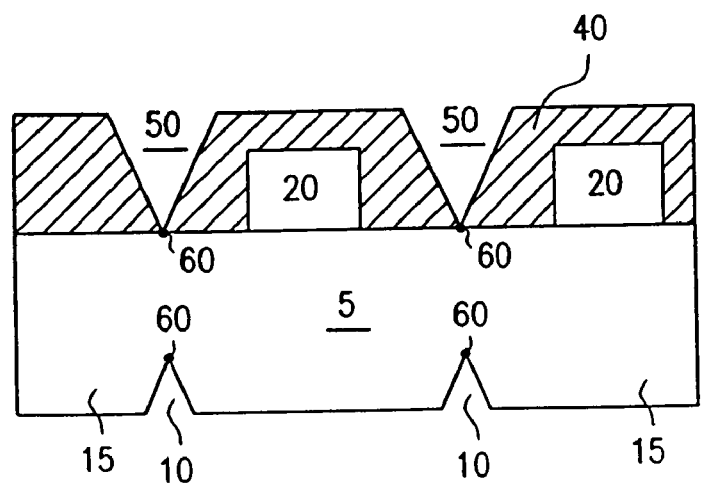
FIG. 6B illustrates the semiconductor package with a formed mold.
Figure 6C:
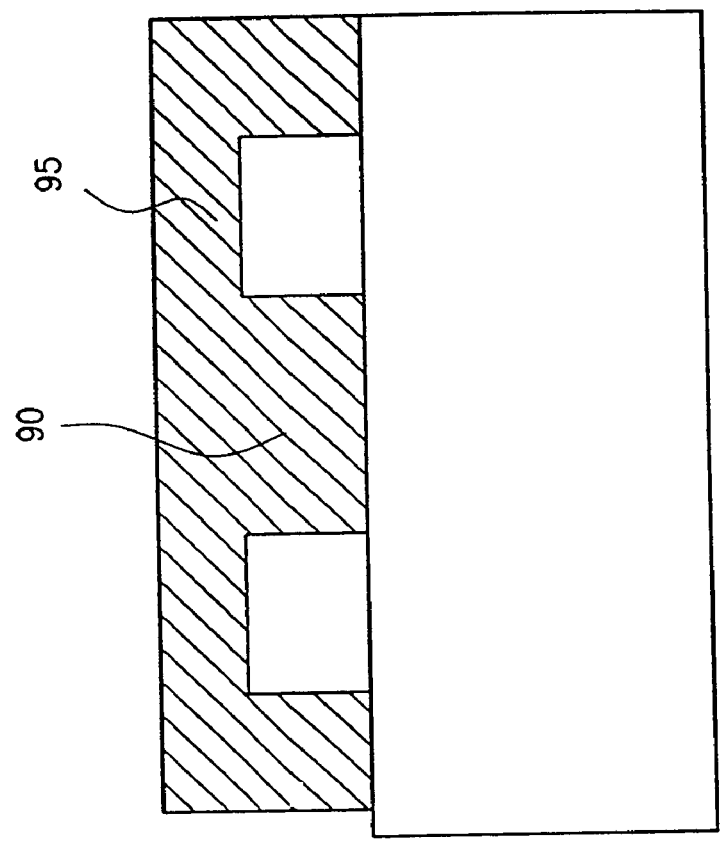
FIG. 6C illustrates a prior art package with a formed mold.

Referring to FIG. 6C, in a known molding system, when the encapsulant 95 is formed, the material of the encapsulant 95 forms not only around the die, but also in gaps 90 of adjacent die. During sawing, the blade slices through the material in the gaps 90 to singulate the packages. This cutting operation increases the stress on the blade and supplies pressure which may damage the semiconductor die and the electrical connections.

To reduce the effects of pressure on the semiconductor die, it has been found that grooves 50 may be formed in the encapsulant which correspond to grooves 10 of the substrate 5. This permits segments 15 to be easily detached from substrate 5 by forming break points from grooves 10 and 50 in the substrate.

Referring to FIG. 6A, the package 1 is sealed by an encapsulant 40 which may be transfer molded. Encapsulant 40 protects the semiconductor die and electrical connections 18 against damage and environmental hazards such as chemicals and residue during packaging. Encapsulant 40 may be formed from any number of conventional mold compounds.

Encapsulant 40 may be, for example, a multiple cavity mold. In this processing regime, encapsulant 40 includes an upper member 70 and a lower member 72, which form a cavity 75 to surround the semiconductor die 20. A gate (not shown) is formed in the upper portion through which a resin is supplied to the cavity during the molding operation. The molding resin may be moved inside the cavity by, for example, a plunger (not shown).

During operation, the semiconductor die package is mounted between the upper member 70 and the lower member 72 by a loading frame or other suitable device. The encapsulant is applied to the cavity 75 and subjected to a suitable temperature to cure the resin. Suitable temperatures are between 150–200° C. Next, the package body is removed from the encapsulant for singulation. As shown in FIG. 6A, a plurality of projections are formed in upper member 70 of the encapsulant 40 to form a plurality of grooves 50 in the sealed semiconductor package.

Referring to FIG. 6B, grooves 50 are formed such that they generally correspond to grooves 10 in substrate 5 to form a plurality of breakage points 60. Grooves 50 are formed at an angle relative to substrate 5. For example, grooves 50 may be formed in the shape of a "V". Grooves 50 may have a depth of about 90% of the thickness of the encapsulant.

During packaging, the segments 15 are separated from one another by a punching, breaking, shearing, or other suitable operation to break the substrate 5 at break points 60 formed by grooves 10 and 50. It is contemplated that grooves 10 and 50 may be sufficiently formed such that a machining process is not needed to separate the substrate into individual circuit packages.

The present invention has been described in terms of number of embodiments. The invention, however, is not limited to the embodiments depicted and described. For example, grooves 10 and 50 may be formed perpendicular to the substrate 5, and encapsulant 40 may be in the form of a glob top.

What is claimed is:

1. A method of forming an array of semiconductor packages, said method comprising:

dividing a substrate into a plurality of segments by forming a first plurality of grooves on said substrate;

forming an array of semiconductor dies over said plurality of segments, each semiconductor die formed to be substantially aligned with a segment; and forming an encapsulant having a second plurality of grooves over said array of semiconductor dies.

2. The method according to claim 1, wherein said step of forming an encapsulant having a second plurality of grooves is performed such that said second plurality of grooves are substantially aligned with said first plurality of grooves.

3. The method according to claim 1, wherein said step of forming an encapsulant having a second plurality of grooves comprises:

providing an upper member over said array of semiconductor dies, said upper member surrounding, and forming a cavity around, each semiconductor die;

providing a resin in said cavity; and removing said upper member.

4. The method according to claim 1, wherein said first plurality of grooves is formed on an upper surface of said substrate.

* * * * *

UNITED STATES PATENT AND TRADEMARK OFFICE
CERTIFICATE OF CORRECTION

PATENT NO. : 7,056,771 B2 Page 1 of 1
APPLICATION NO. : 11/174608
DATED : June 6, 2006
INVENTOR(S) : David J. Corisis It is certified that error appears in the above-identified patent and that said Letters Patent is hereby corrected as shown below:

The following errors are corrected:

Column 1, line 18, "dice" should read --dies--;

Column 1, line 36, "dice" should read --dies--;

Column 1, line 52, "connection" should read --connections--;

Column 1, line 64, "includes" should read --include--;

Column 2, line 4, "dice" should read --dies--;

Column 2, lines 10-11, "dice" should read --dies--;

Column 2, line 23, "dice" should read --dies--;

Column 2, line 25, "dice" should read --dies--; and

Column 3, line 54, "also formed" should read --also be formed--.

Signed and Sealed this

Thirty-first Day of October, 2006

JON W. DUDAS
*Director of the United States Patent and Trademark Office*